US012720678B2

(12) United States Patent
Dedhia et al.

(10) Patent No.: US 12,720,678 B2
(45) Date of Patent: Aug. 25, 2026

(54) COMPACT INTERFACE THROUGH HINGE CONNECTOR

(71) Applicant: Apple Inc., Cupertino, CA (US)

(72) Inventors: Parin R Dedhia, Sunnyvale, CA (US); Andrew N Leopold, San Francisco, CA (US); Bilal Mohamed Ibrahim Kani, Singapore (SG); Henry H Yang, San Jose, CA (US); Jun Zhang, San Jose, CA (US); Kishore N Renjan, Singapore (SG); Manoj Vadeentavida, Singapore (SG); Takayoshi Katahira, San Jose, CA (US)

(73) Assignee: Apple Inc., Cupertino, CA (US)

( * ) Notice: Subject to any disclaimer, the term of this patent is extended or adjusted under 35 U.S.C. 154(b) by 233 days.

(21) Appl. No.: 18/581,357

(22) Filed: Feb. 19, 2024

(65) Prior Publication Data

US 2025/0106995 A1 Mar. 27, 2025

Related U.S. Application Data

(60) Provisional application No. 63/585,631, filed on Sep. 27, 2023.

(51) Int. Cl.
*H05K 1/11* (2006.01)
*H05K 1/02* (2006.01)
*H05K 3/321* (2026.01)

(52) U.S. Cl.
CPC ........... *H05K 1/111* (2013.01); *H05K 1/0216* (2013.01); *H05K 3/321* (2013.01); *H05K 2201/10189* (2013.01); *H05K 2201/10356* (2013.01)

(58) Field of Classification Search
CPC ...... H05K 1/111; H05K 1/0216; H05K 3/321; H05K 2201/10189; H05K 2201/10356
(Continued)

(56) References Cited

U.S. PATENT DOCUMENTS 7,280,372 B2 * 10/2007 Grundy .................. H05K 1/183 361/792
8,514,589 B2 * 8/2013 Mikami ............ H01R 13/5833 439/582

(Continued)

FOREIGN PATENT DOCUMENTS

WO 2012030366 A1 3/2012
WO 2021211777 A1 10/2021

OTHER PUBLICATIONS

International Search Report and Written Opinion for PCT Application No. PCT/US2024/046259 dated Dec. 19, 2024; 11 pgs.

*Primary Examiner* — Binh B Tran
(74) *Attorney, Agent, or Firm* — Fletcher Yoder, P.C.

(57) ABSTRACT

Electronic devices and methods include a first electronic device that includes a printed circuit board and a quad plug connector coupled to a first surface of a printed circuit board. A first set of wires is coupled to a second surface of the printed circuit board, and the first set of wires are parallel to each other and are located on a first plane. A second set of wires is coupled to the second surface of the printed circuit board. The second set of wires are parallel to each other and are located on a second plane. The first and second planes are each parallel to each other and to the second surface of the printed circuit board. Moreover, the first set of wires is vertically above the second set of wires.

20 Claims, 12 Drawing Sheets

(58) Field of Classification Search
USPC .......................................................... 361/748
See application file for complete search history.

(56) References Cited

U.S. PATENT DOCUMENTS

| | | | | |
|---|---|---|---|---|
| 2004/0094328 | A1* | 5/2004 | Fjelstad | H01R 12/714 174/251 |
| 2006/0091517 | A1 | 5/2006 | Yoo et al. | |
| 2015/0222029 | A1 | 8/2015 | Neu et al. | |
| 2016/0143153 | A1 | 5/2016 | Stay et al. | |
| 2021/0091491 | A1* | 3/2021 | Wang | H01R 24/60 |

* cited by examiner 172
174
174
170
176

202
204
208
214
200
80
136
138
140
150
152
206
210
212

COMPACT INTERFACE THROUGH HINGE CONNECTOR

CROSS-REFERENCE TO RELATED APPLICATIONS

This application claims priority to U.S. Application No. 63/585,631, filed Sep. 27, 2023, entitled "COMPACT INTERFACE THROUGH HINGE CONNECTOR," which is incorporated by reference herein in its entirety for all purposes.

BACKGROUND

This application relates to interfaces between a first system in a package (SIP) and a second SIP.

An electronic device may include various circuit components among two or more SIPs. As device sizes decrease and/or other components increase in size, it becomes more pressing that a high signal density and small form factor architecture is used to couple devices with relatively small volumes even through flexes and/or hinges. One possibility for deploying such interfaces may include using a flexible printed circuit board (FPCB). However, the FPCBs may be unable to meet system fit and/or hinge architecture requirements (e.g., size). Another alternative may include using micro-coaxial cable (MCX) bundles through hinges to support smaller hinge architectures and/or higher density of signals through the hinge. However, the termination of MCX bundles also may not meet system fit requirements.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another.

Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment", "an embodiment", or "some embodiments" of the present disclosure are not intended to be interpreted as excluding the existence of additional embodiments that also incorporate the recited features. Use of the term "approximately" or "near" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Figure 1:
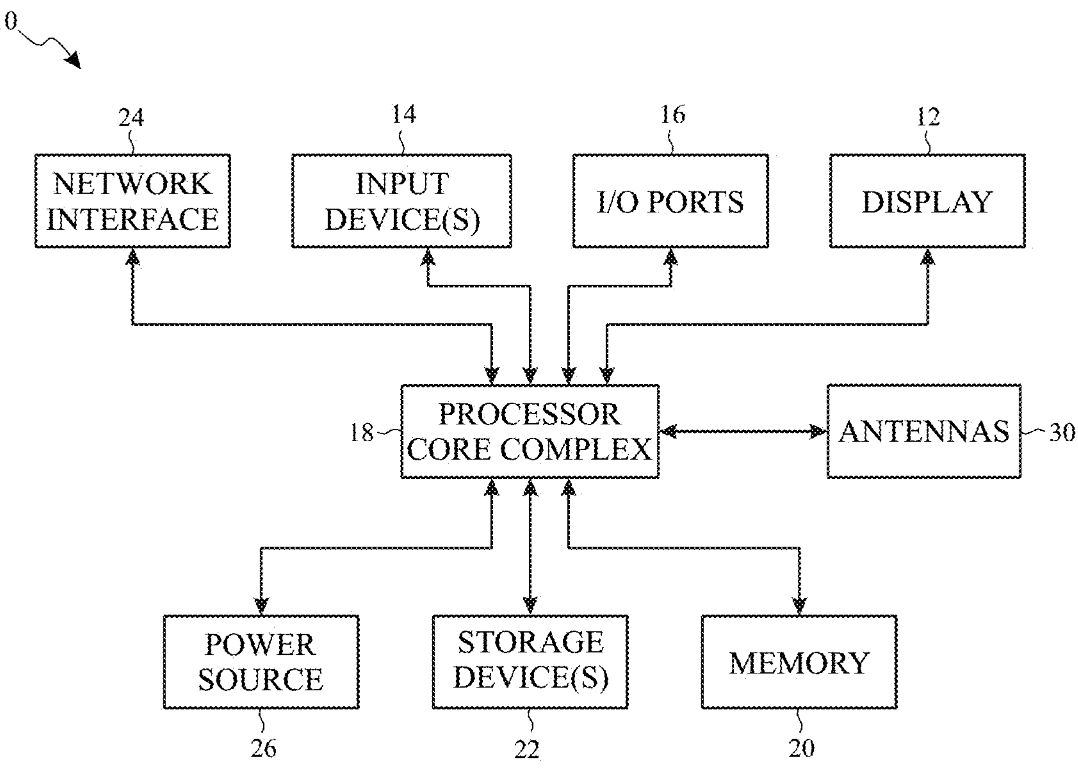
FIG. 1 is a block diagram of an electronic device, according to an embodiment of the present disclosure.

An electronic device 10 including an electronic display 12 is shown in FIG. 1. As is described in more detail below, the electronic device 10 may be any suitable electronic device, such as a computer, a mobile phone, a portable media device, a tablet, a television, a virtual-reality headset, a wearable device such as a watch, a vehicle dashboard, or the like. Thus, it should be noted that FIG. 1 is merely one example of a particular implementation and is intended to illustrate the types of components that may be present in an electronic device 10.

The electronic device 10 includes the electronic display 12, one or more input devices 14, one or more input/output (I/O) ports 16, a processor core complex 18 having one or more processing circuitry(s) or processing circuitry cores, local memory 20, a main memory storage device 22, a network interface 24, a power source 26 (e.g., power supply), and one or more antennas 30. The various components described in FIG. 1 may include hardware elements (e.g., circuitry), software elements (e.g., a tangible, non-transitory computer-readable medium storing executable instructions), or a combination of both hardware and software elements. It should be noted that the various depicted components may be combined into fewer components or separated into additional components. For example, the local memory 20 and the main memory storage device 22 may be included in a single component.

The processor core complex 18 is operably coupled with local memory 20 and the main memory storage device 22. Thus, the processor core complex 18 may execute instructions stored in local memory 20 and/or the main memory storage device 22 to perform operations, such as generating or transmitting image data to display on the electronic display 12. As such, the processor core complex 18 may include one or more general purpose microprocessors, one or more application specific integrated circuits (ASICs), one or more field programmable logic arrays (FPGAs), or any combination thereof.

In addition to program instructions, the local memory 20 or the main memory storage device 22 may store data to be processed by the processor core complex 18. Thus, the local memory 20 and/or the main memory storage device 22 may include one or more tangible, non-transitory, computer-readable media. For example, the local memory 20 may include random access memory (RAM) and the main memory storage device 22 may include read-only memory (ROM), rewritable non-volatile memory such as flash memory, hard drives, optical discs, or the like.

The network interface 24 may communicate data with another electronic device or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, or a wide area network (WAN), such as a 4G, Long-Term Evolution (LTE), or 5G cellular network.

The power source 26 may provide electrical power to one or more components in the electronic device 10, such as the processor core complex 18 or the electronic display 12. For example, the power source 26 may include a power supply rail and/or a ground terminal coupled to the one or more components in the electronic device 10, such as the processor core complex 18 or the electronic display 12, to provide the electrical power. Thus, the power source 26 may include any suitable source of energy, such as a rechargeable lithium polymer (Li-poly) battery or an alternating current (AC) power converter.

The I/O ports 16 may enable the electronic device 10 to interface with other electronic devices. For example, when a portable storage device is connected, the I/O port 16 may enable the processor core complex 18 to communicate data with the portable storage device.

The input devices 14 may enable user interaction with the electronic device 10, for example, by receiving user inputs via a button, a keyboard, a mouse, a trackpad, or the like. The input device 14 may include touch-sensing components in the electronic display 12. The touch sensing components may receive user inputs by detecting occurrence or position of an object touching the surface of the electronic display 12.

The electronic display 12 may include driver circuitry (e.g., display driver circuitry) and/or a display panel. The display panel may include pixel circuitry with an array of display pixels. Moreover, the driver circuitry may include various circuitry to provide one or more stable positive and/or negative supply voltages, such the power supply rail and/or the ground terminal. Image data for display on the electronic display 12 may be generated by an image source, such as the processor core complex 18, a graphics processing unit (GPU), or an image sensor. Additionally, in some embodiments, image data may be received from another electronic device 10, for example, via the network interface 24 and/or an I/O port 16. Similarly, the electronic display 12 may display frames based on image data generated by the processor core complex 18, or the electronic display 12 may display frames based on image data received via the network interface 24, an input device, or an I/O port 16.

Figures 2, 3:
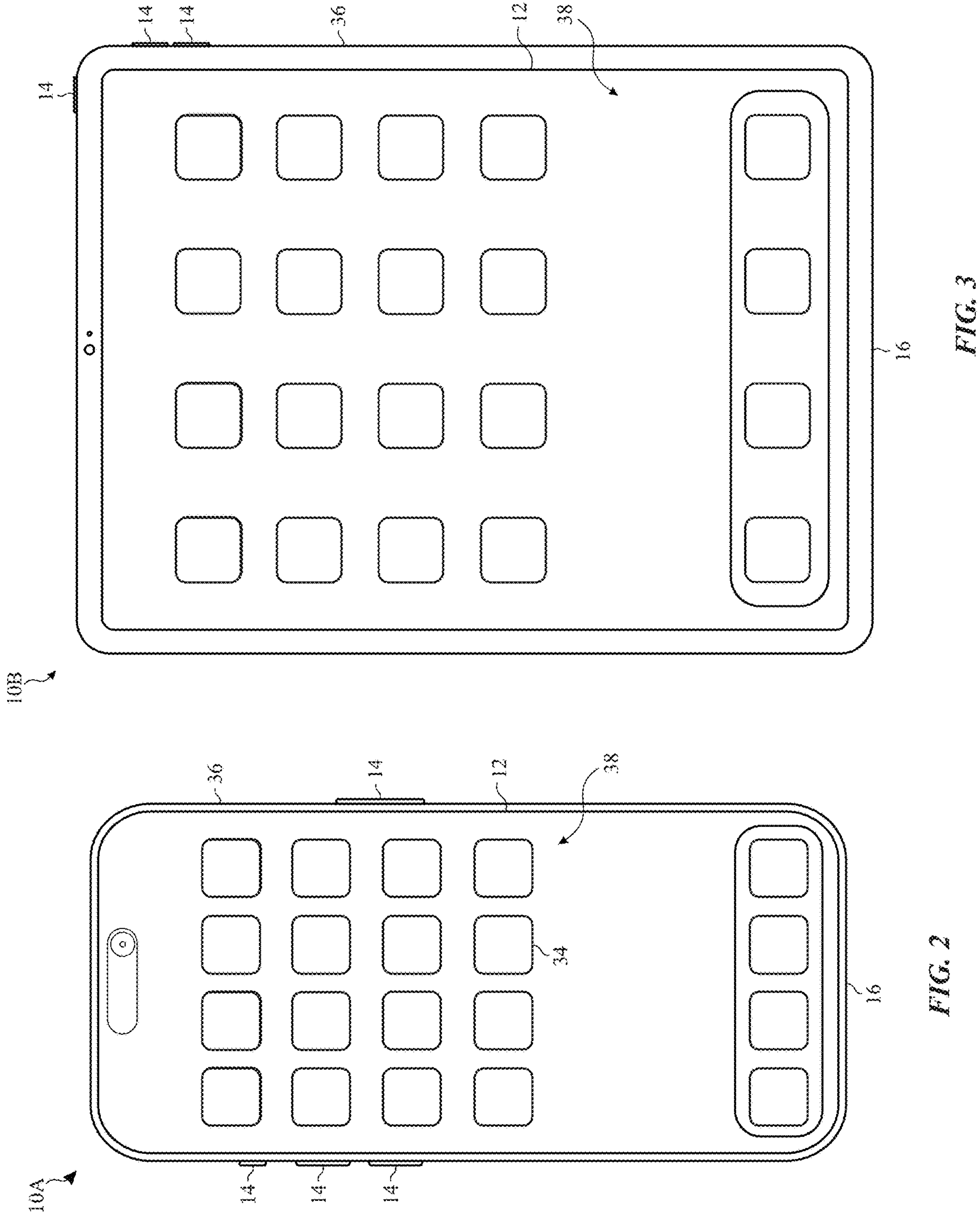
FIG. 2 is an example of the electronic device of FIG. 1, in accordance with an embodiment.
FIG. 3 is an example of the electronic device of FIG. 1, in accordance with an embodiment.

The electronic device 10 may also have the one or more antennas 30 electrically coupled to the processor core complex 18. The electronic device 10 may be any suitable electronic device. To help illustrate, an example of the electronic device 10, a handheld device 10A, is shown in FIG. 2. The handheld device 10A may be a portable phone, a media player, a personal data organizer, a handheld game platform, or the like. For illustrative purposes, the handheld device 10A may be a smart phone, such as any IPHONE® model available from Apple Inc.

The handheld device 10A includes an enclosure 36 (e.g., housing). The enclosure 36 may protect interior components from physical damage or shield them from electromagnetic interference, such as by surrounding the electronic display 12. The electronic display 12 may display a graphical user interface (GUI) 38 having an array of icons. When an icon 34 is selected either by an input device 14 or a touch-sensing component of the electronic display 12, an application program may launch.

The input devices 14 may be accessed through openings in the enclosure 36. The input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, or toggle between vibrate and ring modes.

Figure 4:
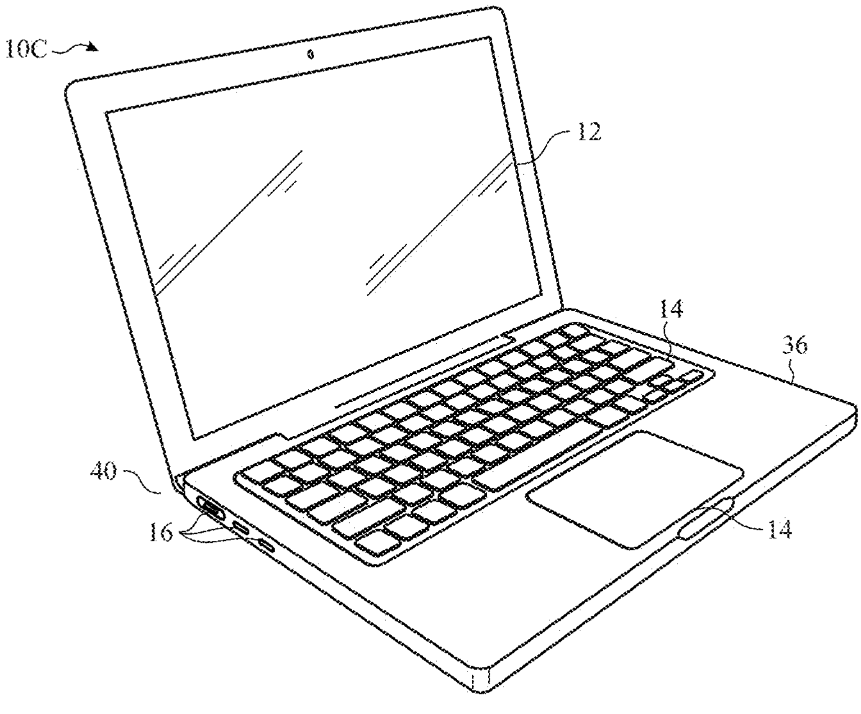
FIG. 4 is an example of the electronic device of FIG. 1, in accordance with an embodiment.
Figure 5:
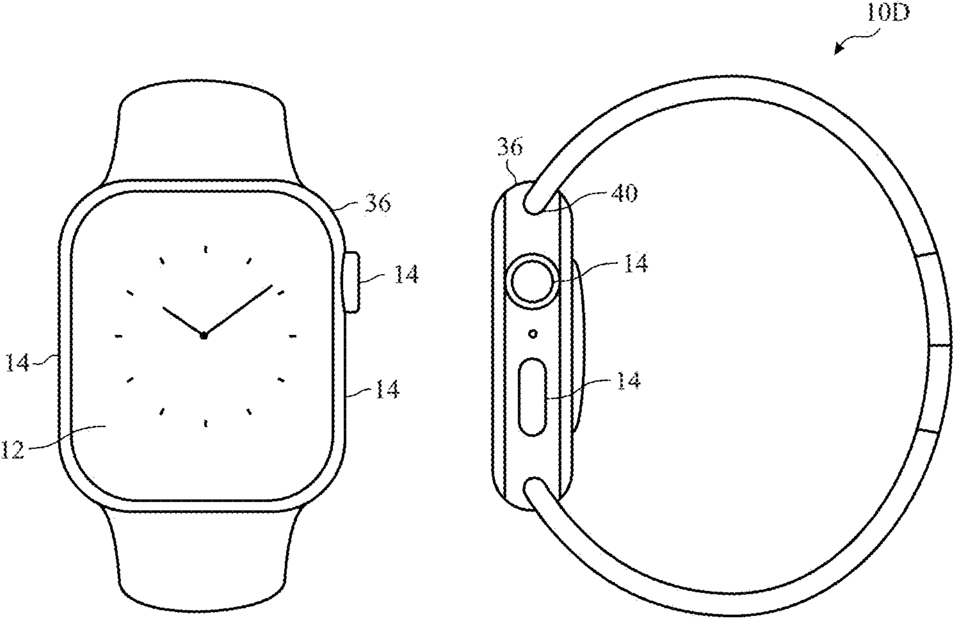
FIG. 5 is an example of the electronic device of FIG. 1, in accordance with an embodiment.
Figure 6:
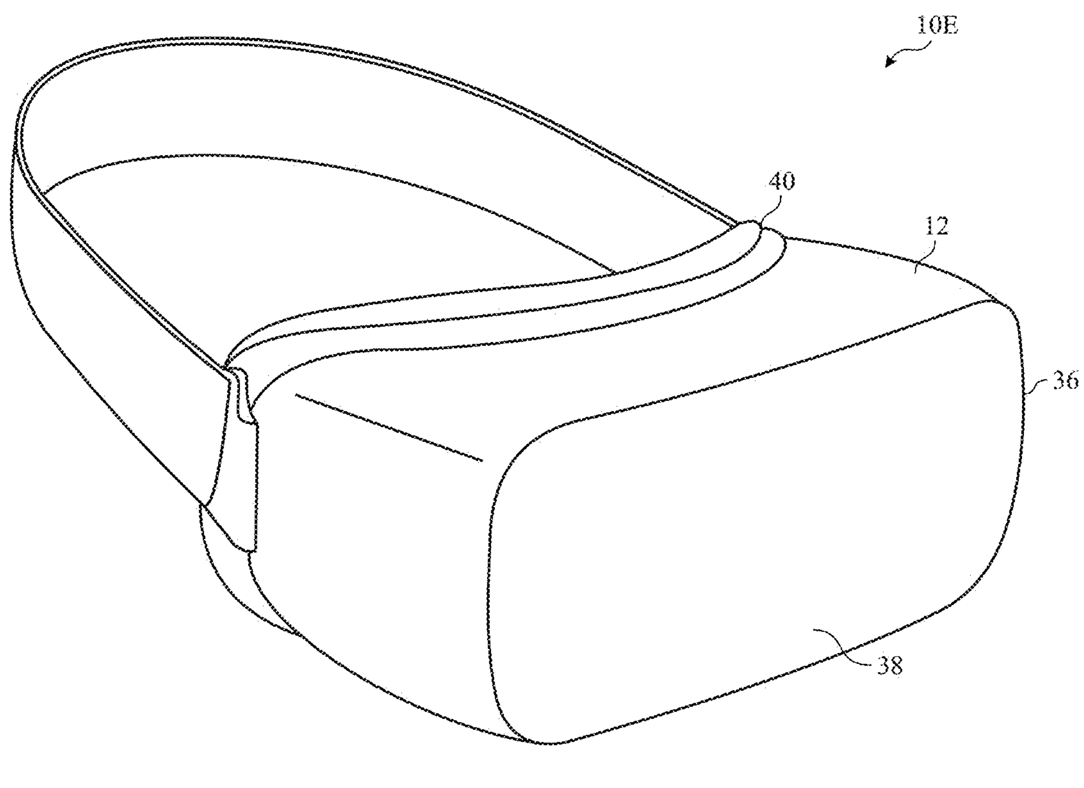
FIG. 6 is an example of the electronic device of FIG. 1, in accordance with an embodiment.

Another example of a suitable electronic device 10, specifically a tablet device 10B, is shown in FIG. 3. The tablet device 10B may be any IPAD® model available from Apple Inc. A further example of a suitable electronic device 10, specifically a computer 10C, is shown in FIG. 4. For illustrative purposes, the computer 10C may be any MACBOOK® or IMAC® model available from Apple Inc. Another example of a suitable electronic device 10, specifically a watch 10D, is shown in FIG. 5. For illustrative purposes, the watch 10D may be any APPLE WATCH® model available from Apple Inc. As a further example of a suitable electronic device 10 as a wearable electronic device, specifically a headset 10E, is shown in FIG. 6. For illustrative purposes, the headset 10E may be an APPLE VISION PRO® model available from Apple Inc. The principles disclosed herein may also be applied to any other suitable embodiments of the electronic device 10.

Figure 7:
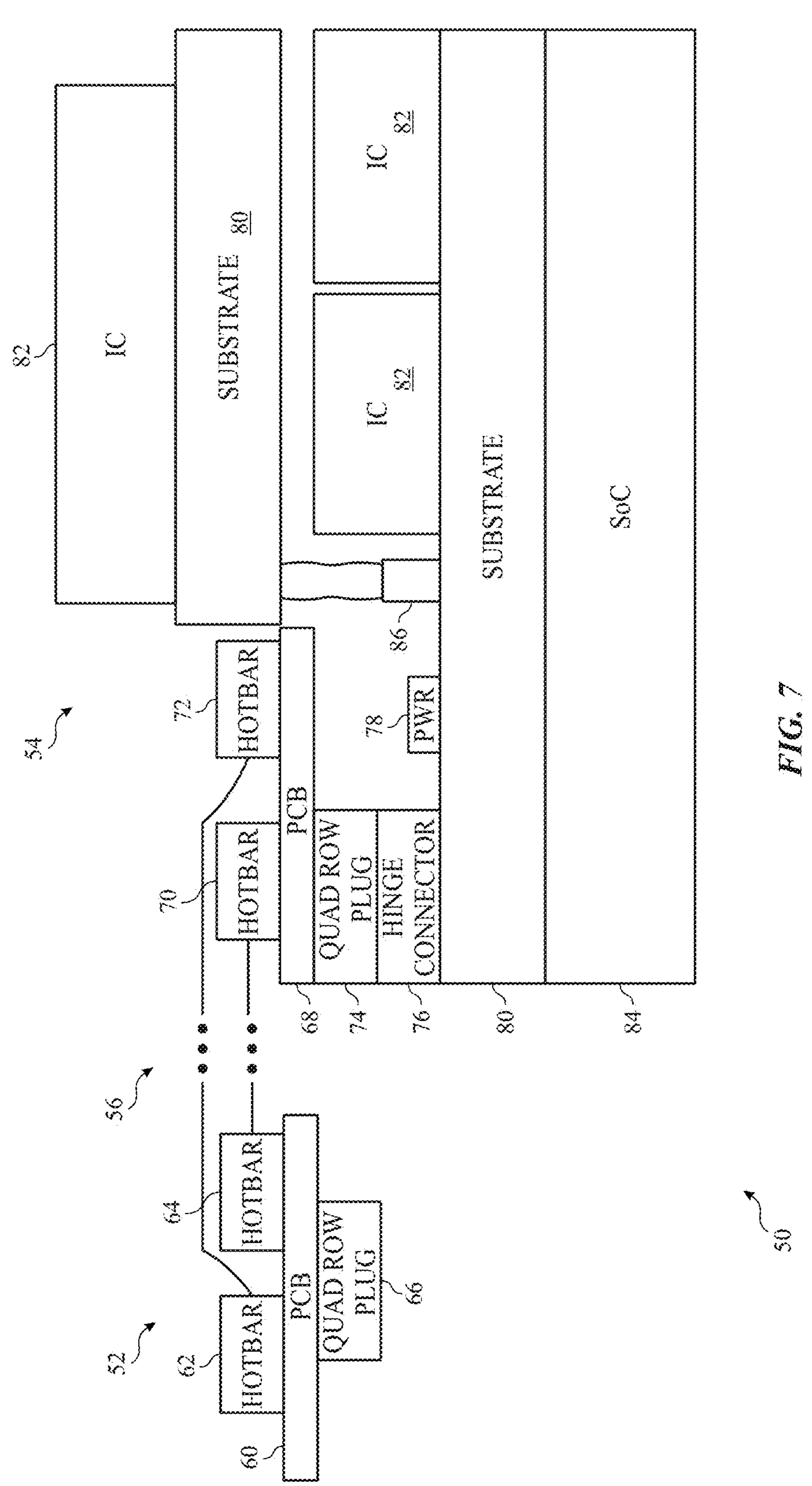
FIG. 7 is a block diagram of a system of the electronic device of FIG. 1 that includes a connection between electronic devices using hot bars, in accordance with an embodiment.

As depicted, the handheld device 10A, the tablet device 10B, the computer 10C, the watch 10D, and the headset 10E each also includes an electronic display 12, a processor core complex 18, and an enclosure 36. The electronic display 12 may display a GUI 38. As illustrated in FIG. 5, the GUI 38 may show a visualization of a clock. When the visualization is selected either by the input device 14 or a touch-sensing component of the electronic display 12, an application program may launch, such as to transition the GUI 38 to presenting the icons 34 discussed with respect to FIGS. 2 and 3. Furthermore, some embodiments of the electronic devices 10 may include a hinge 40 to mechanically couple at least one component with another. Furthermore, in some embodiments, different SIPs (and/or any integrated circuit devices/systems) that are to communicate together may be on opposite sides of the hinge 40. Thus, some connection between the SIPs may be passed using a flexible connection through the hinge 40. As previously noted, the flexible connection (e.g., via MPCB or MCX bundles) through the hinge 40 is to be terminated with SIPs that may be unable to fit within system fit requirements and/or hinge architecture requirements. To address these issues, FIG. 7 shows a system 50 that couples an electronic device 52 with an electronic device 54 using an interface 56. The electronic devices 52 and/or 54 may include one or more integrated circuit (IC) devices (e.g., a system-in-package (SIP)) and/or any other suitable electronic devices that may use communication between the different devices. In the illustrated embodiment, the electronic device 52 includes a printed circuit board (PCB) 60 coupled to hot bars 62 and 64 that provide an interface for wires (e.g., MCX cable bundles) to interface with the electronic device 52. A hot bar may refer to a bonding technique to bond wires to a device (e.g., the electronic device 52). For instance, a hot bar may be soldered and heated using a thermode or hot bar to melt the solder (resoldering) to create an electro-mechanical bond between the wires and the bonded-to device.

As discussed below, the wiring connections with the hot bars 62 and 64 may enable the interface 56 to meet system fit/architecture requirements. The electronic device 52 may also be coupled to other components, such as other PCBs, other SIPs, and/or any other suitable electronic devices. To provide this connection, the electronic device 52 comprises a quad row plug (QRP) interface 66. For instance, the QRP interface 66 may be a quad-row connector, any other high-density pin count board-to-board connector, or any other mechanism to couple to the other PCBs, other SIPs, and/or other suitable electronic devices. In other words, the quad-row connector may be used with a cable bundle (e.g., MCX) rather than the flex terminations with which quad-row connectors may typically only be used.

In some embodiments, the electronic device 54, like the electronic device 52, includes a PCB 68 coupled to hot bars 70 and 72 that provide an interface for wires (e.g., MCX cable bundles) to interface with the electronic device 54. The PCB 68 may include a single layer board or a multiple layer board. The electronic device 54 may also be coupled to other components, such as other PCBs, other SIPs, and/or any other suitable electronic devices. To provide this connection, the electronic device 54 comprises an interface 74. For instance, like the QRP interface 66, the interface 74 may be a quad-row connector, any other high-density pin count board-to-board connector, or any other mechanism to couple to the other PCBs, other SIPs, and/or other suitable electronic devices. In some embodiments, the QRP interface 66 and the interface 74 may be the same type of interface or may be different types of interfaces. In some embodiments, one or more of hot bars 62, 64, 70 and 72 include components to enable photonic coupling, such as but not limited to waveguides, optical fibers, photonic wire bonds, optical transmitters, optical receivers, optical-electrical converters, photodetectors, and light sources.

Embodiments of the electronic device 54 may contain more or fewer components than are illustrated in FIG. 7. In the illustrated embodiment of the electronic device 54, the electronic device 54 includes a hinge connector 76 to couple the electronic device 54 (and related cables) to the hinge 40. The electronic device 54 may also include power circuitry 78 to provide power to the electronic device 54 and/or the electronic device 52. In some embodiments, the power circuitry 78 may include, be supplemented by, and/or be replaced by any other integrated circuits and/or passive components.

As illustrated, the electronic device 54 may include one or more substrates 80 to which the hinge connector 76 and/or the PCB 68 couple via the interface 74. The electronic device 54 includes one or more substrates 80 that couple to other components, such as ICs 82. The ICs may provide various functions for the electronic device 10 (and/or its sub-component the electronic device 54) and/or implement some of the elements of electronic device 10 as described in relation to FIGS. 1-6. For instance, the ICs 82 may include an IC to provide wireless communications capability as part of the network interface 24. Additionally or alternatively, the ICs 82 may include an audio chip to provide output for the electronic device 10. Additionally, the ICs 82 may include circuitry used to debug and/or provide power management of the electronic device 10/electronic device 54. Regardless, the electronic device 54 may include fewer or more ICs 82. In some embodiments, the electronic device 54 may include a system on a chip (SoC) 84. Moreover, the electronic device 54 may include one or more interposers 86 to enable ICs 82 or other circuitry to communicate through/between the one or more substrates 80.

It may be understood that alternative arrangements of the electronic device 54 may be utilized that include more or fewer ICs 82, more or fewer substrates 80, with or without an SoC 84, with or without the PCB 68, or any other variations of the electronic device 54.

Figure 8:
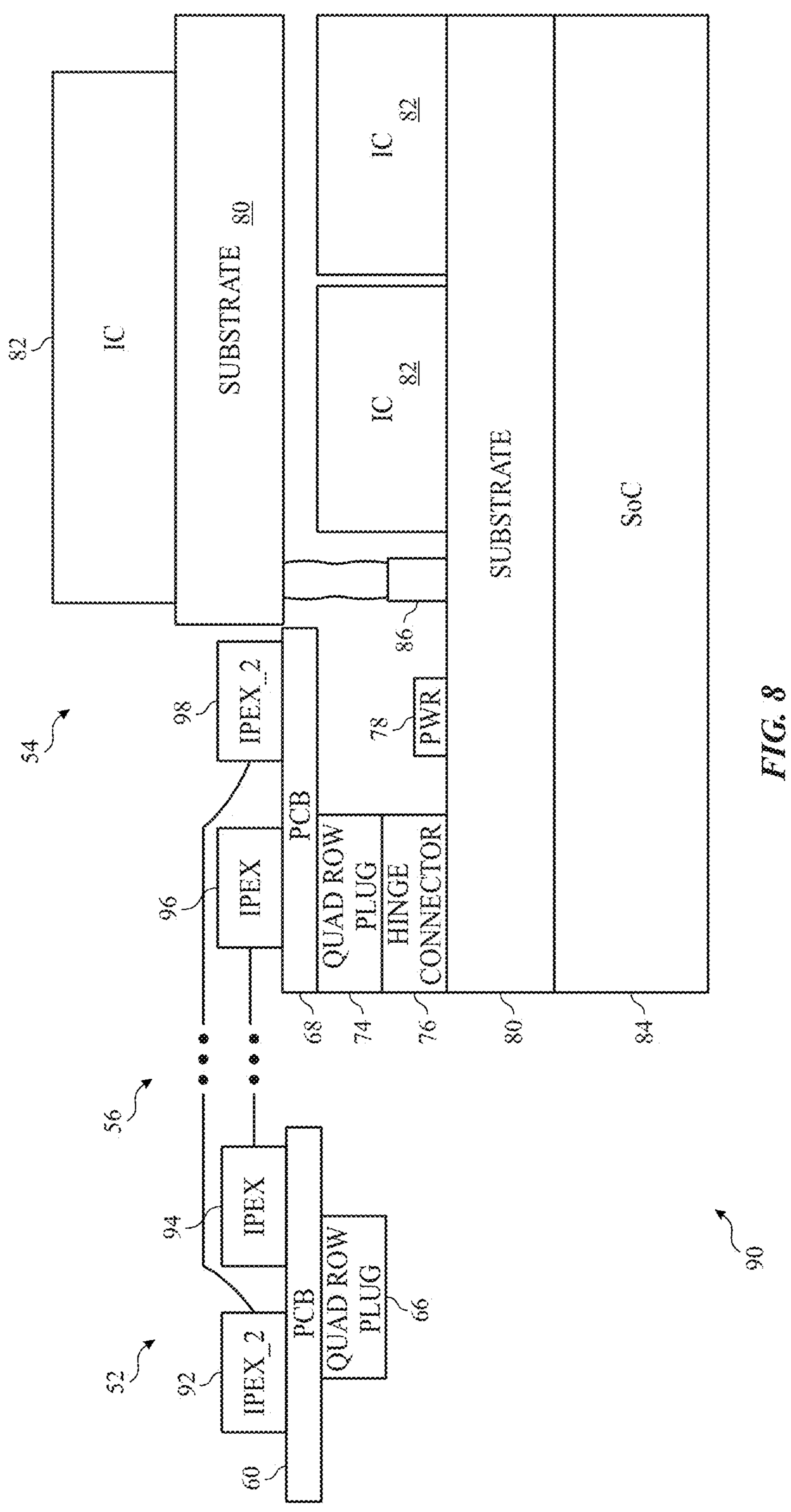
FIG. 8 is a block diagram of a system of the electronic device of FIG. 1 that includes a connection between electronic devices using connectors, in accordance with an embodiment.

FIG. 8 shows a system 90 that couples an embodiment of the electronic device 52 with an embodiment of the electronic device 54 using the interface 56. The system 90 is similar to the system 50 except that the electronic device 52 includes dual connectors 92 and 94 and the electronic device includes dual connectors 96 and 98. Although figures may refer to the dual connectors 96 and 98 as IPEX, the connectors may be any relatively small form factor connector, such as an IPEX UX-Z, another coaxial cable connector types, or suitable connector type. Like the dual row hot bars 62, 64, 70, and 72 of the system 50, the dual connectors 92, 94, 96, and 98 enable the electronic devices 52 and 54 to use the quad-row connectors 66 and 74 using cable bundles (e.g., MCX) without using a flex connector through the hinge 40 that may typically be the only interfaces used with quad-row connectors. By placing the connectors 92, 94, 96, and 98 and/or the hot bars 62, 64, 70, and 72 in interleaved dual rows, the overall XY footprint (e.g., plane of the PCBs 60 and 68) may be reduced even if the Z footprint (e.g., height above the PCBs 60 and 68) is expanded. Furthermore, using the dual row hot bar with stacked ground bars (as discussed below) reduces the XY footprint while also enabling high speed signals (e.g., low-power display port (LPDP)) closer to shorter pins and low speed further away to improve de-sense\electromagnetic interference\signal integrity performance. This further enhances the reworkability and/or repairability of the systems 50 and 90.

Figure 9:
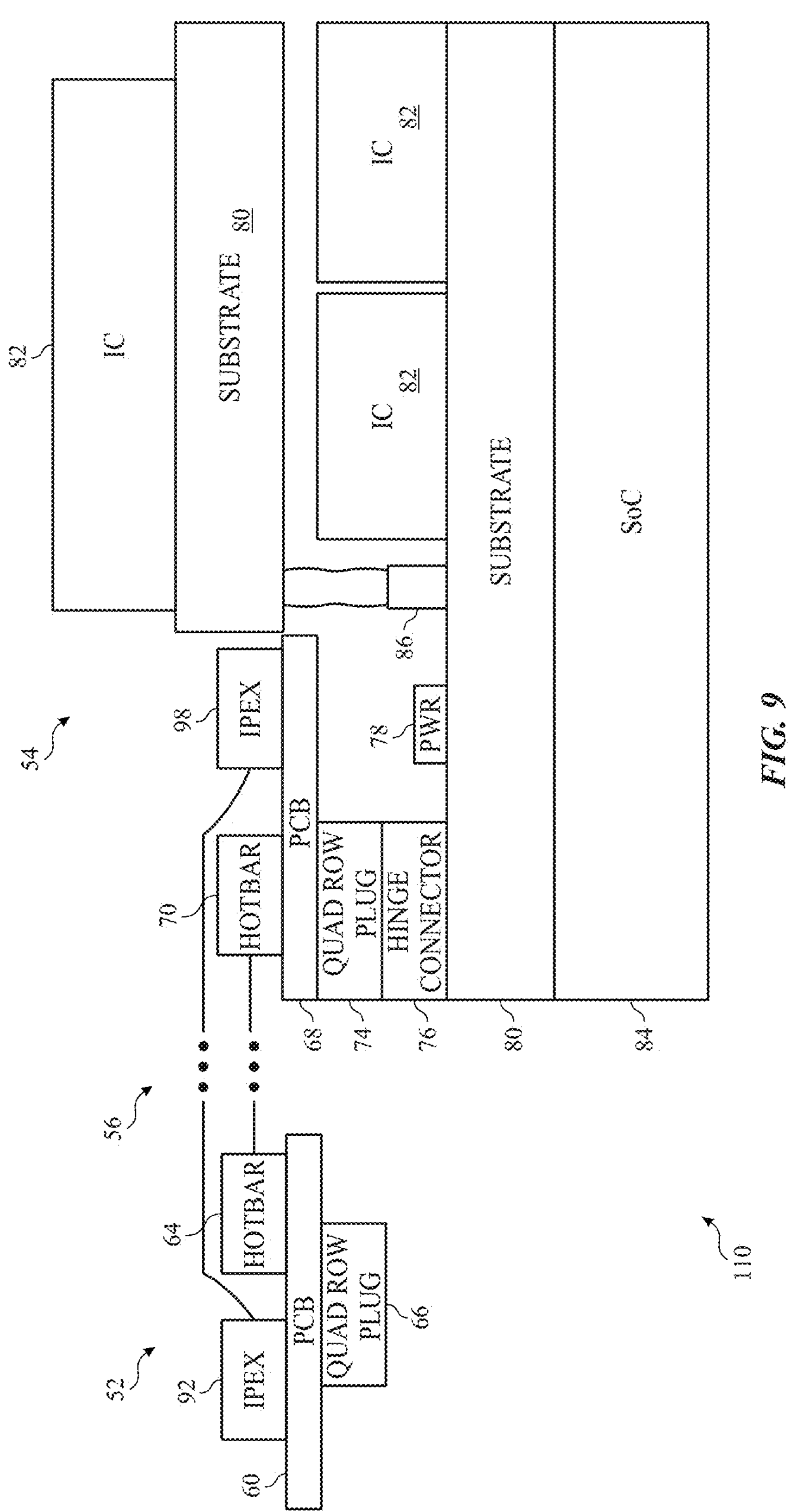
FIG. 9 is a block diagram of a system of the electronic device of FIG. 1 that includes a connection between electronic devices using hot bars and connectors, in accordance with an embodiment.

In some embodiments, the electronic device 52 and/or the electronic device 54 may use a combination of connectors and hot bars to terminate wires in the interface 56. For instance, FIG. 9 shows a system 110 that couples an embodiment of the electronic device 52 with an embodiment of the electronic device 54 using the interface 56. Except that the electronic device 52 and the electronic device 54 includes a combination of connectors and hot bars. For instance, the electronic device 52 includes the connector 92 and the hot bar 64. Likewise, the electronic device 54 includes the hot bar 70 and the connector 98.

Figure 10:
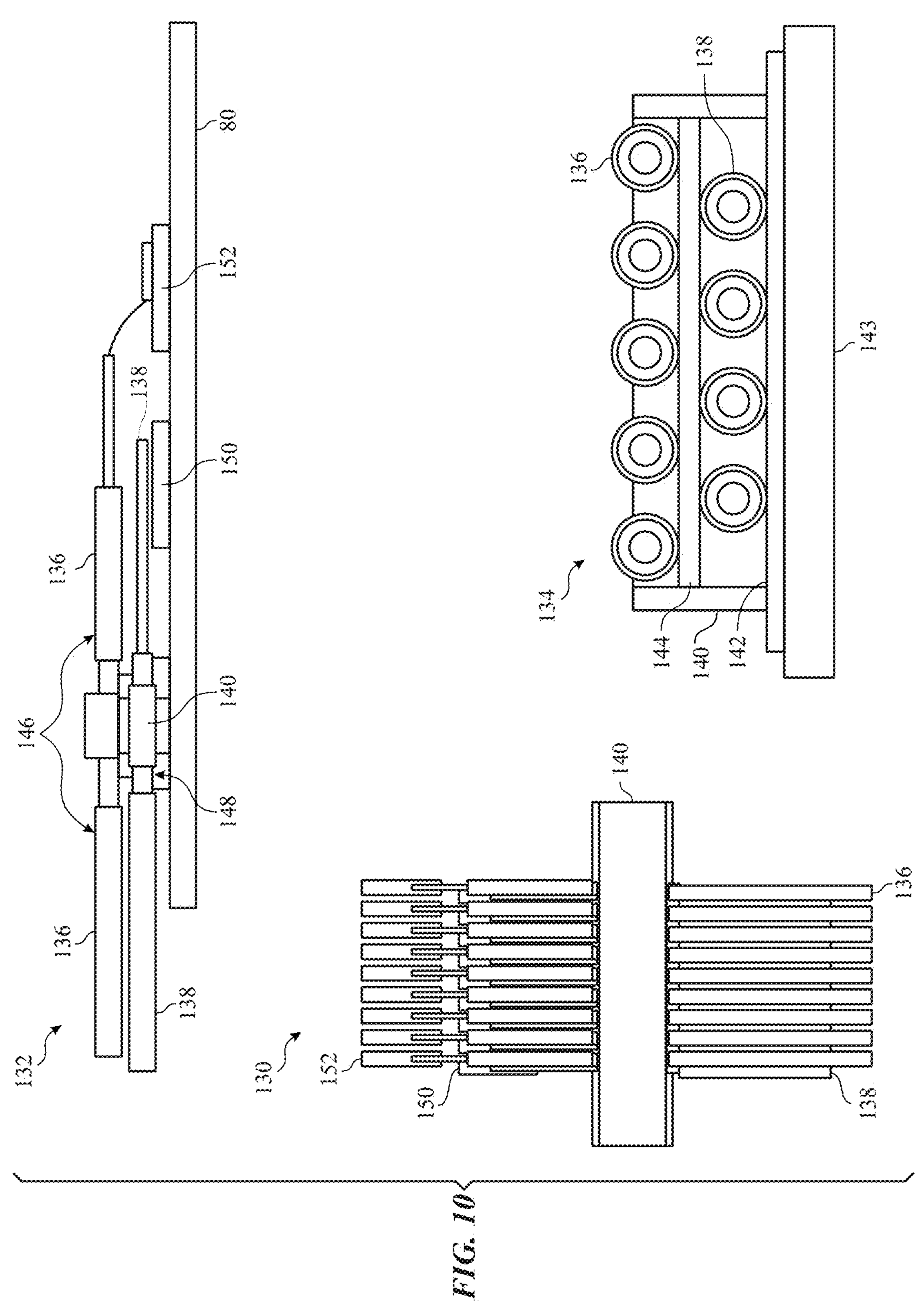
FIG. 10 is a multiple perspective view of a hot bar connection of FIG. 7 or FIG. 9, in accordance with an embodiment.

As previously noted, two hot bars (e.g., hot bars 62 and 64) may use a common ground bar to bond wires to the device (e.g., PCB 60). For instance, FIG. 10 shows a top-down view 130, a side view 132, and a simplified cross-sectional view 134 of a hot bar interface using wires 136 and 138 using a ground bar 140. The number of wires 136 and/or 138 may vary from the numbers of the various views or even between views shown in FIG. 10 without impacting the teachings of the present disclosure. The wires 136 are arranged parallel in a plane, and the wires 138 are arranged parallel in another plane. The wires 136 and 138 (and their respective planes) are approximately parallel with each other and may be approximately parallel with a surface of the substrate 80/printed surface of the PCBs 60 or 68. Furthermore, the wires 136 are vertically above the wires 138. As used herein, "vertically above" indicates that the wires 136 are on an opposite side of the wires 138 than the substrate 80/printed surface of the PCBs 60 or 68.

The ground bar 140 may include a first layer 142 below the wires 138 and coupled to the substrate 143. The substrate 143 may be a substrate of the PCB 60 or 68, the illustrated substrates 80 of FIGS. 7-9, and/or any other substrates in the electronic device 10. The ground bar 140 also may include a second layer 144 between the wires 136 and the wires 138. In some embodiments, a layer may be located above the wires 136 away from the substrate 143 in place of or in addition to the first layer 142 and/or the second layer 144. The interface may also include segment striping 146 and ground shielding 148 at the ground bar 140. For instance, the wires 136 may be segment striped where the ground shielding 148 of the wires 136 are exposed to the ground bar 140 in one segment at the ground bar while the ground shielding is protected in other regions of the segment striping around the ground bar 140.

The interface also includes pads 150 used to couple respective wires of the wires 138 to the substrate 80 as a first hot bar connection (e.g., hot bar 62). Similarly, the interface also includes pads 152 used to couple respective wires of the wires 136 to the substrate 80 as the hot bar connection (e.g., hot bar 64). In some embodiments, one or more of substrate 80 and PCB 60 may comprise a glass substrate. In some embodiments, ground bar 140 may further include one or more components to enable photonic coupling, such as but not limited to waveguides, optical fibers, photonic wire bonds, optical transmitters, optical receivers, optical-electrical converters, photodetectors and light sources. In some embodiments, ground bar 140 may enable optical-electrical conversion on one or more wires 136 or 138, for example to receive an electrical signal on a copper wire on one side of ground bar 140 and through the use of one or more optical electrical conversion components, output an optical signal on a rigid or flexible photonic wire on the other side of ground bar 140.

Furthermore, as indicated in the illustrated embodiment of the interface of FIG. 10, the wires 136 and the wires 138 may be offset to reduce interference between the wires and/or enable a more compact orientation of the wires 136 and the wires 138. Furthermore, the principles of the hot bar interface of FIG. 10 may be applied to the connector embodiments with offset of the wires 136 and 138 oriented with the wires 136 being higher than the wires 138 in the Z direction and located between wires 138 in the X or Y direction. A connector (e.g., custom small-form factor connector) may receive the wires 136 at a higher location terminated at a first location (e.g., corresponding to the first hot bar) and the wires 138 at a lower location terminated at a second location (e.g., corresponding to the second hot bar) both located within the connector. In other words, the connector may sacrifice some compactness in the Z direction to save space in the XY directions.

In some embodiments, when the hot bars are operating at relatively high data rates, such as high-speed Low Power DisplayPort (LPDP) or DP, connections may transfer data at a rate greater that 11 Gbps. At these high frequencies, the hot bar pads (e.g., pads 150 and/or 152) may leak EMI noise that may interfere with wireless communications (e.g., WiFi, Bluetooth, etc.). The interface 56 may be shielded with a continuous grounding to avoid EMI/de-sense issues. This shielding may be implemented using a conductive pressure sensitive adhesive on the ground bar 140, the cables/wires may be wrapped with fan out tape that is grounded to the multi-layer board (e.g., PCBs 60 or 68) with a fan out foam on the multiple-layer board/main logic board. However, these shielding techniques may be custom and require device-specific designs such as plastic molding and/or metallic shapes.

Figure 11:
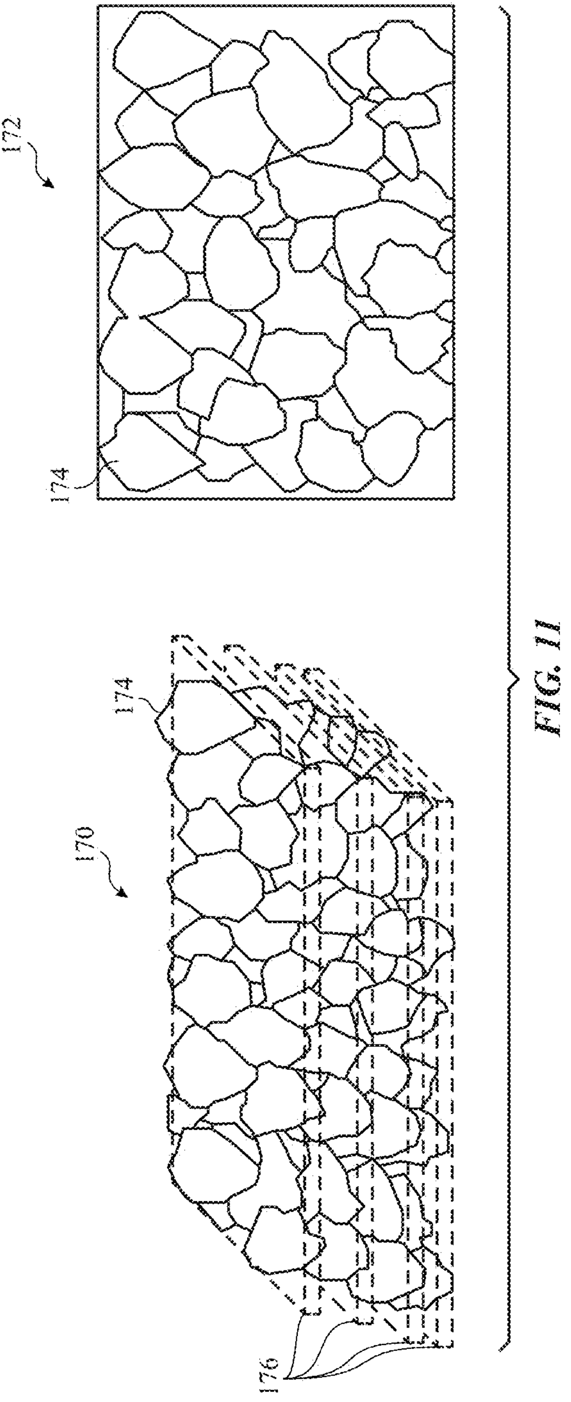
FIG. 11 is an example of a conductive material-filled stretchable adhesive film that includes conductive flakes in the conductive material-filled stretchable adhesive film, in accordance with an embodiment.

Additionally or alternatively, a conductive material-filled stretchable adhesive film may be used to provide a conforming adaptive shielding. The stretchability of the adhesive film enables the film to be deposited in a relatively small volume compared to non-stretchable shielding. Additionally, the stretchability enables the shielding to at least partially wrap around the individual wires 136 and/or 138 to enable a compliant shield coverage. For instance, the wraparound of the shielding may provide at least some protection for wires from adjacent wires in the wire bundle beyond the self-shielding that may be integrated into the wires themselves. FIG. 11 shows a perspective view 170 and a top-down view 172 of an embodiment of the conductive material-filled stretchable adhesive film. The conductive material-filled stretchable adhesive film may include conductive flakes 174. The conductive flakes 174 may include a suitable conductive material, such as silver (Ag) and/or any other suitable conductive materials. After the conductive material-filled stretchable adhesive film is disposed on the interface 56 in one or more layers 176, the one or more layers 176 may be pressed together/compressed. After the conductive material-filled stretchable adhesive film is pressed, the conductive flakes 174 are pressed together causing a connection that provides conductivity. Furthermore, in some embodiments, the conductive material-filled stretchable adhesive film may be sized/designed to have similar resistance range to tin-based (Sn) or tin/copper-based (SAC) shielding.

Figure 12:
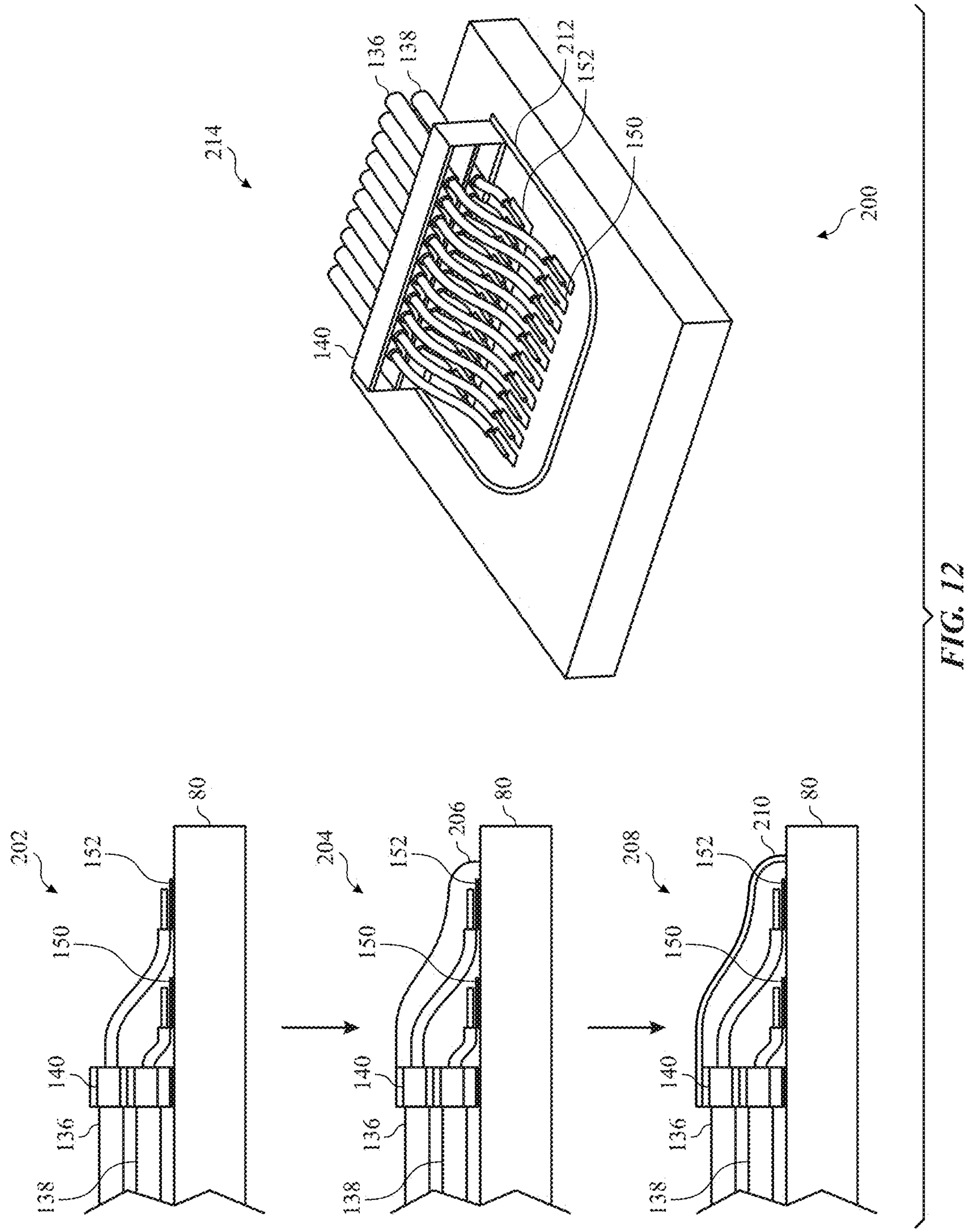
FIG. 12 is a flow diagram of a process for using one or more shield layers to at least partially shield pads from receiving or transmitting EMI within the electronic device of FIG. 1, in accordance with an embodiment.

FIG. 12 is a process flow for a process 200 for a shielding system that may be deployed in the interface 56. The process flow for the process 200 includes a side view 202 of the interface like the side view 132 of FIG. 10. The process flow for the process 200 includes a side view 204 where an insulation layer 206 is dispensed on the interface 56. The insulation layer 206 provides protection and insulation for the wires 136 and 138 and the pads 150 and 152. For instance, the insulation layer 206 protects the wires 136 and 138 and the pads 150 and 152 from connecting with other components, such as the shielding film of FIG. 11. Furthermore, the insulation layer 206 may provide strain relief that strengthens the connection/reduces chances of mechanical/connection failures for the wires in the termination of the interface 56. The insulation layer 206 may be formed of any suitable insulating material, such as epoxy.

The process flow for the process 200 includes a side view 208 with shield layer(s) 210. As previously noted, the shield layer(s) 210 may include the conductive material-filled stretchable adhesive film that is disposed on the interface 56. The conductive material-filled stretchable adhesive film/shield layer(s) 210 is then compressed on the ground bar 140 and ground connection 212 shown in perspective view 214. The ground connection 212 may be disposed around the pads 150. The ground connection 212 and the ground bar 140 being connected to the shield layer(s) 210 provide a continuous grounding connection around the pads 150 and 152. This continuous grounding connection through the shield layer(s) 210 may be used to at least partially block EMI noise escaping from the pads 150 and 152 to interfere with other components in the electronic device 10 and/or at least partially protect the pads 150 and 152 from outside EMI. In some embodiments, at least one of the wires 136 and/or 138 may be coupled to ground for inclusion in the interface 56.

Figures 13, 14:
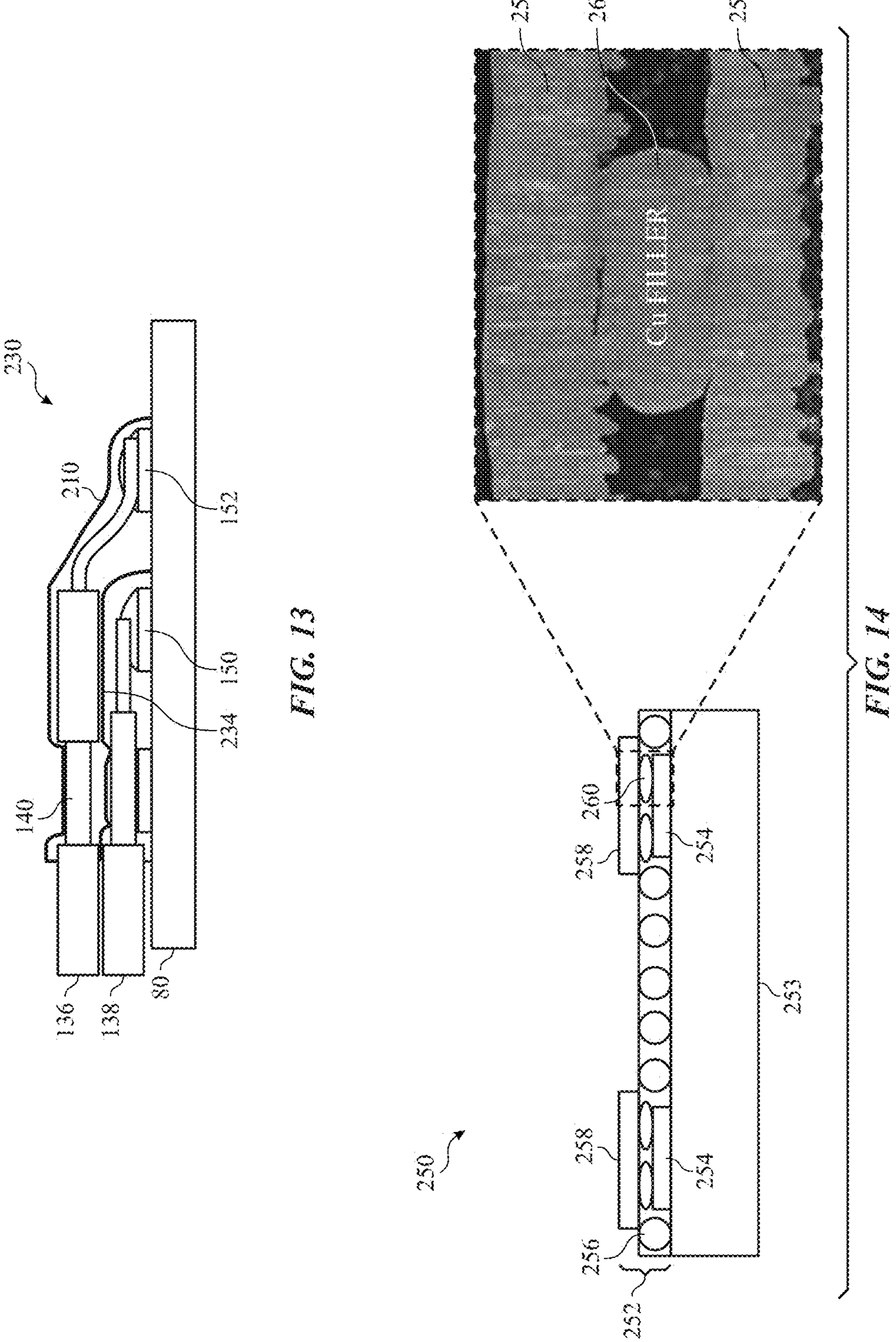
FIG. 13 is a side view of a portion of an interface that includes using two or more distinct shield layers to at least partially shield pads from receiving or transmitting EMI within the electronic device of FIG. 1, in accordance with an embodiment.
FIG. 14 is a conductive system that uses conductive fillers to electro-mechanically couple a conductive sheet to conductive surfaces using heat and/or pressure, in accordance with an embodiment.

Although the one or more shield layers 210 of FIG. 12 are shown to be contiguous and disposed on top of the wires 136, some embodiments of the interface 56 may include one or more shielding layers between the wires 136 and the wires 138 in addition to or alternative to the one or more shielding layers on top of the wires 136. For instance, FIG. 13 shows a side view of a system 230 that is similar to the side view 208 except that shield layer(s) 210 is supplemented with second shield layer(s) 234. In some embodiments, the system 230 may use a single ground connection to the substrate/PCB for both sections of shielding protection. In some embodiments, the shield layer(s) 234 may be coupled to a ground connection around the pads 150 like the ground connection 212 is coupled to the shield layer(s) 210 around the pads 152. Moreover, the shield layer(s) 234 are also coupled to the ground bar 140. Using these ground connections, the shield layer(s) 234 provide protection against EMI to and from the pads 150 like the shield layer(s) 210 provide protection against EMI to and from the pads 152. Specifically, the shield layer(s) 234 provide EMI protection between the pads 150 and the pads 152 to at least partially prevent them from interfering with each other.

In some embodiments, the shielding layer(s) 210 and/or 234 may be deployed using alternatives to conductive flakes instead relying on a conductive filler material. For instance, FIG. 14 shows a conductive system 250 that includes shielding layers 252 disposed on a substrate 253 and one or more conductive surfaces 254, such as the pads 150 and 152. The shielding layers 252 use conductive fillers 256 to provide a conductive connection between the conductive surfaces 254 and a conductive layer/sheet 258. The conductive filler 256 may include a shape (e.g., ball) of conductive material (e.g., copper) that may be set using pressure and/or temperature to establish an electro-mechanical connection with the conductive surfaces 254 and the conductive layer/sheet 258 to form set fillers 260. The conductive layer/sheet 258 may include a conductive sheet of material (e.g., copper).

Figure 15:
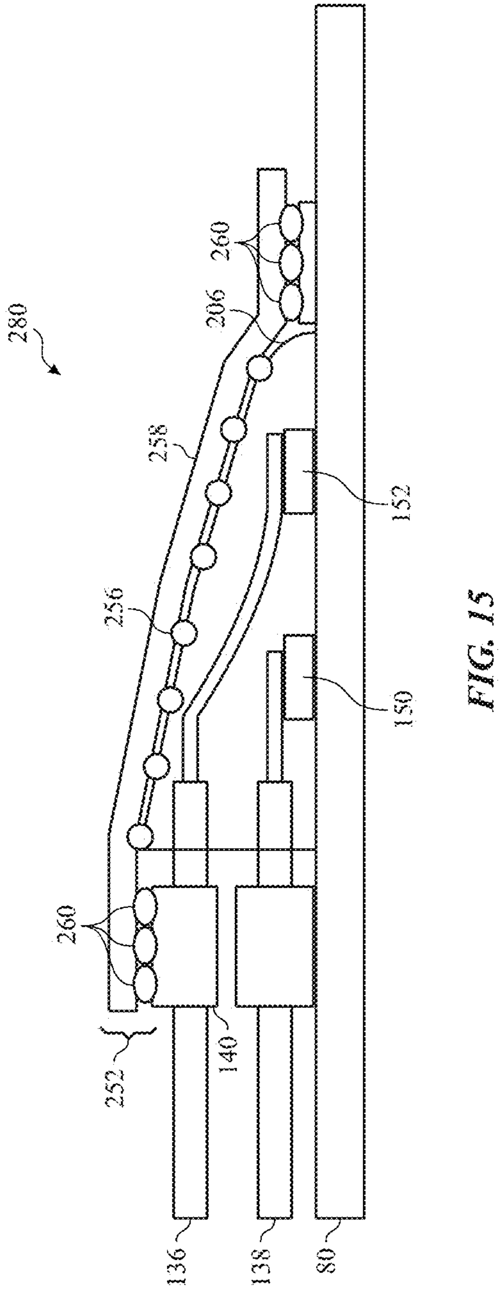
FIG. 15 is a side view of a portion of an interface that includes using the conductive fillers of FIG. 14 to at least partially shield pads from receiving or transmitting EMI within the electronic device of FIG. 1, in accordance with an embodiment.

FIG. 15 is a side view 280 of a portion of the interface 56 that uses the shield layers 252. The side view 280 is similar to the side view 208 except that the shield layers 252 are used instead of the shield layer(s) 210. As illustrated, the set fillers 260 enable the shield layers 252 to at least partially protect the pads 150 and/or 152 from receiving and/or giving off EMI to other devices in the electronic device 10. In certain embodiments, the shield layers 252 may be applied between the wires 136 and 138 like the shield layer(s) 234 of FIG. 13. Furthermore, in some embodiments of the interface 56, a mix of shield layer(s) 210, shield layer(s) 234, and/or shield layers 252 may be used to shield pads 150 and/or 152. Additionally, as illustrated, at least some of the conductive fillers 256 are not set and thus do not couple the conductive sheet 258 to an interior of the shield layers 252. Since such lack of connections may be at least partially insulating, the insulation layer 206 may be omitted for at least some embodiments. Similarly, the insulation layer may be omitted from some embodiments that utilize the shield layer(s) 210 and/or the shield layer(s) 234.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

What is claimed is:

1. An electronic device comprising:

a first electronic device comprising a printed circuit board and a quad plug connector coupled to a first surface of the printed circuit board;

a first plurality of wires coupled to a second surface of the printed circuit board, wherein the first plurality of wires are parallel to each other and are located on a first plane;

a second plurality of wires coupled to the second surface of the printed circuit board, wherein the second plurality of wires are parallel to each other and are located on a second plane, wherein the first and second planes are each parallel to each other and to the second surface of the printed circuit board, and the first plurality of wires is vertically above the second plurality of wires; and a ground bar comprising a first layer below the second plurality of wires and a second layer between the first plurality of wires and the second plurality of wires.

2. The electronic device of claim 1, wherein the first surface of the printed circuit board is opposite of the second surface of the printed circuit board.

3. The electronic device of claim 1, wherein the first electronic device comprises a system-in-package.

4. The electronic device of claim 1, comprising:
a hinge; and
a wire bundle comprising the first and second pluralities of wires, wherein the wire bundle is configured to provide communications through the hinge.

5. The electronic device of claim 1, comprising a second electronic device coupled to the first and second pluralities of wires.

6. The electronic device of claim 1, wherein the wires of the first plurality of wires are interleaved with the wires of the second plurality of wires.

7. The electronic device of claim 1, wherein the first electronic device comprises:
a first set of pads on the second surface of the printed circuit board;
a first hot bar used to couple the first plurality of wires to the first set of pads;
a second set of pads on the second surface of the printed circuit board; and
a second hot bar used to couple the second plurality of wires to the second set of pads.

8. The electronic device of claim 7, wherein the ground bar is electromechanically coupled to the second surface of the printed circuit board and is coupled to the first and second pluralities of wires.

9. The electronic device of claim 8, wherein the first electronic device comprises a film with conductive material that is coupled to the printed circuit board and the ground bar and is configured to at least partially shield electromagnetic interference from escaping the first set of pads and the second set of pads during operation of the electronic device.

10. The electronic device of claim 1, wherein the first plurality of wires or the second plurality of wires is coupled to the second surface of the printed circuit board using at least one physical connector electromechanically coupled to the second surface of the printed circuit board.

11. An electronic device comprising:
a first electronic device comprising:
a printed circuit board having a quad plug connector coupled to a first surface of the printed circuit board;
first and second sets of pads coupled to a second surface of the printed circuit board; and
a ground bar coupled to the second surface of the printed circuit board;
a first plurality of wires coupled to the second surface of the printed circuit board using a first hot bar connection configured to couple the first plurality of wires to the first set of pads, wherein the first plurality of wires are parallel to each other and are located on a first plane, and the first plurality of wires is coupled to the ground bar; and
a second plurality of wires coupled to the second surface of the printed circuit board using a second hot bar connection configured to couple the second plurality of wires to the second set of pads, wherein the second plurality of wires are parallel to each other and are located on a second plane, the second plurality of wires is coupled to the ground bar, the first and second planes are each parallel to each other and to the second surface of the printed circuit board, and the first plurality of wires is vertically above the second plurality of wires.

12. The electronic device of claim 11, wherein the first electronic device comprises a shield layer coupled to the ground bar, wherein the shield layer is configured to at least partially block electromagnetic interference to or from the first and second set of pads.

13. The electronic device of claim 12, wherein the shield layer comprises a stretchable film with conductive flakes configured to electrically couple with the ground bar.

14. The electronic device of claim 13, wherein the stretchable film is stretched at least partially around the wires of the first plurality of wires to provide electromagnetic interference protection between the wires of the first plurality of wires.

15. The electronic device of claim 13, wherein the stretchable film is configured to be compressed near the ground bar and the printed circuit board to cause the conductive flakes to form a connection with the ground bar and with a ground connection on the printed circuit board.

16. The electronic device of claim 12, wherein the shield layer comprises:
a conductive sheet formed from a conductive material; and
a conductive filler disposed between the ground bar and the conductive sheet and between the conductive sheet and a ground connection of the second surface of the printed circuit board, wherein the conductive filler is configured to provide an electrical connection between the conductive sheet, the ground bar, and the ground connection after the conductive filler is set near the ground bar and the ground connection.

17. The electronic device of claim 16, wherein the conductive filler is configured to be set using pressure or heat to set conductivity between the ground bar, the conductive sheet, and the ground connection on the printed circuit board.

18. The electronic device of claim 12, wherein the first electronic device comprises a second shield layer between the first plurality of wires and the second plurality of wires and is coupled to the ground bar, wherein the second shield layer is configured to provide electromagnetic interference protection between the first plurality of wires and the second plurality of wires.

19. A method of manufacturing an interface, comprising:
coupling a first plurality of wires to a first plurality of pads on a printed circuit board;
coupling a second plurality of wires to a second plurality of pads on the printed circuit board;
coupling a ground bar to the printed circuit board, wherein the first and second pluralities of wires abut the ground bar;
disposing an insulation layer on the first and second pluralities of wires and the first and second pluralities of pads; and
disposing an adhesive film carrying conductive material on the insulation layer, the ground bar, and the printed circuit board; and
electrically bonding the adhesive film carrying conductive material to electrically couple the ground bar and a ground connection of the printed circuit board to implement a shield layer configured to at least partially block electromagnetic interference from escaping from the first plurality of pads and the second plurality of pads.

20. The method of claim 19, wherein electrically bonding the adhesive film carrying conductive material comprises compressing conductive flakes or filler in the adhesive film carrying conductive material to cause electrical connections to form through the adhesive film carrying conductive material.

* * * * *